United States Patent [19]
Kontani

[11] Patent Number: 5,111,420
[45] Date of Patent: May 5, 1992

[54] ARITHMETIC UNIT USING A DIGITAL FILTER FORMING A DIGITAL SIGNAL PROCESSING SYSTEM WITH SIGNAL BYPASS

[75] Inventor: Tetsuro Kontani, Yokohama, Japan

[73] Assignee: LSI Logic Corporation, Milpitas, Calif.

[21] Appl. No.: 483,585

[22] Filed: Feb. 22, 1990

[30] Foreign Application Priority Data

Feb. 23, 1989 [JP] Japan .................................. 1-41893

[51] Int. Cl.[5] .................. G06F 7/38; G06F 15/61
[52] U.S. Cl. ............................... 364/745; 364/724.03
[58] Field of Search ............ 364/724.01, 724.03, 364/736.05, 737, 745

[56] References Cited

U.S. PATENT DOCUMENTS

| | | | |
|---|---|---|---|
| 3,609,568 | 9/1971 | Jackson | 364/724.03 |
| 3,700,874 | 10/1972 | Heightley | 364/724.03 |
| 3,725,687 | 4/1973 | Heightley | 364/724.03 |
| 4,021,654 | 5/1977 | Harris et al. | 364/724.03 |
| 4,104,729 | 8/1978 | Gingell | 364/724.03 |
| 4,223,389 | 9/1980 | Amada et al. | 364/745 |
| 4,305,133 | 12/1981 | Amada et al. | 364/724.03 |
| 4,507,725 | 3/1986 | Christopher et al. | 364/724.03 |
| 4,722,066 | 1/1988 | Armer et al. | 364/745 |
| 4,811,265 | 3/1989 | Nishitani et al. | 364/745 |
| 4,817,047 | 3/1989 | Nishitani et al. | 364/745 |
| 4,920,507 | 4/1990 | Takeda | 364/724.17 |
| 4,945,507 | 7/1990 | Ishida et al. | 364/736.5 |

OTHER PUBLICATIONS

Landauro et al., "An Overflow Detection and Correction in Digital Filters", *IEEE Trans. on Computers*, vol. C-24, #12, pp. 1226-1228, Dec. 1975.
Drumm, D. B., "Saturation Adder Solves Overflow Problems in 2nd-Order Filters", *Electronic Design*, vol. 28, #18, pp. 167-168, Sep. 1, 1980.
Liu, "Effect of Finite Word Length on the Accuracy of Digital Filters—A Review", IEEE Trans. on Circuit Theory, vol. CT-18, #6, pp. 670-677, Nov. 19, 1971.

*Primary Examiner*—Dale M. Shaw
*Attorney, Agent, or Firm*—Michael D. Rostoker; Gerald E. Linden

[57] ABSTRACT

An arithmetic unit using a digital filter is disclosed, and more particularly an arithmetic unit using a digital filter in which a signal filtered by the digital filter and an original signal are processed to derive therefrom an arithmetic signal.

8 Claims, 3 Drawing Sheets

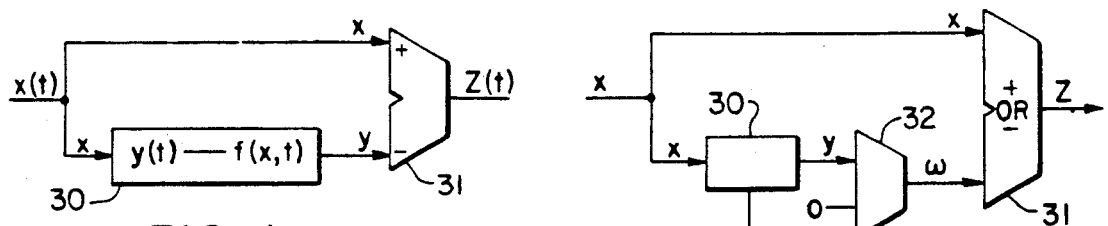
FIG. 1
PRIOR ART
FIG. 2
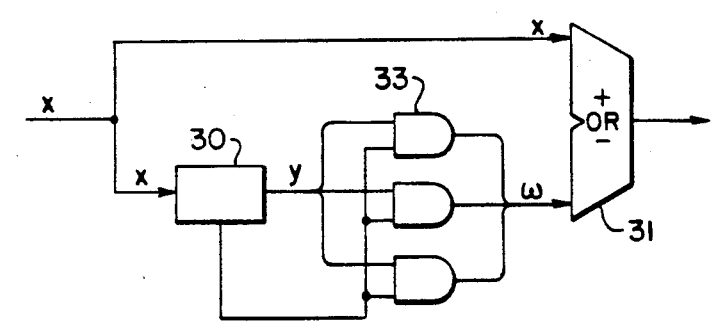
FIG. 3
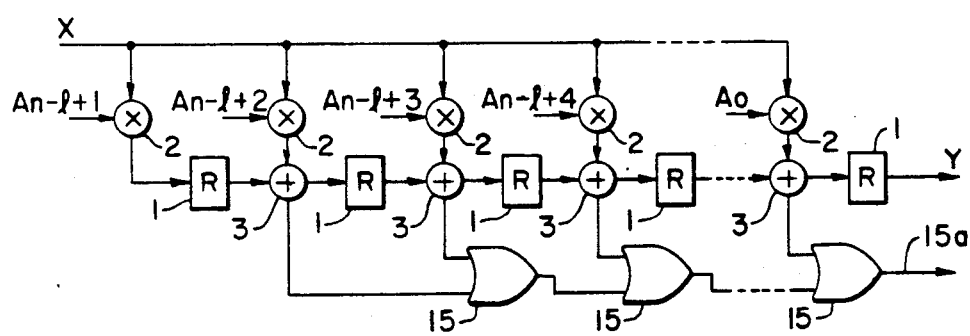
FIG. 4A
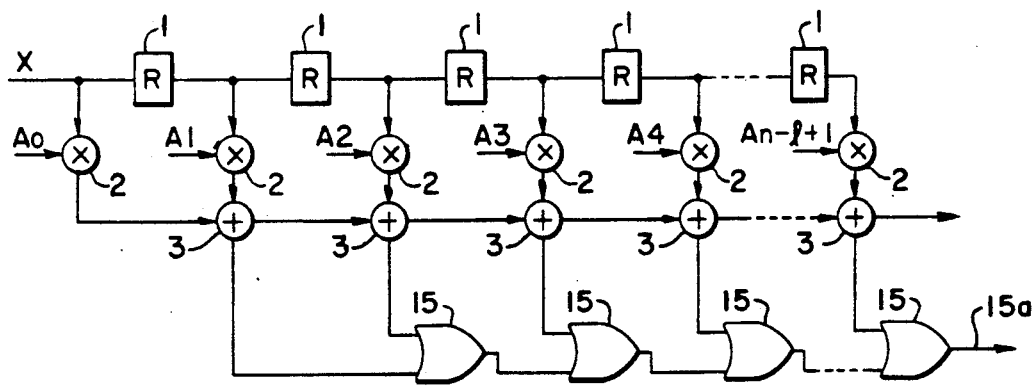
FIG. 4B

ARITHMETIC UNIT USING A DIGITAL FILTER FORMING A DIGITAL SIGNAL PROCESSING SYSTEM WITH SIGNAL BYPASS

CROSS-REFERENCE TO RELATED APPLICATIONS

Attention is directed to commonly-owned, copending U.S. patent application Ser. No. 483,586, entitled Digital Filter with Anomaly Detection and Indication, filed on Feb. 22, 1990 by Kontani, and to commonly-owned, copending U.S. patent application Ser. No. 483,584, entitled Digital Filter System with Anomaly Detection and Indication, filed on Feb. 22, 1990 by Kontani and Miki.

FIELD OF THE INVENTION

The present invention relates to an arithmetic unit using a digital filter, and more particularly to an arithmetic unit using a digital filter in which a signal filtered by the digital filter and an original signal are processed to derive therefrom an arithmetic signal.

DESCRIPTION OF THE PRIOR ART

A transversal filter, also referred to as a tapped delay line filter, provides an output signal derived by multiplying preceding input sample values obtained via delay elements by a filter coefficient and adding the signals obtained from each delay element. If Ai is the filter coefficient, X the input signal (sample value) series, Y the output signal series and the number of delay taps, this can be expressed mathematically by $$Y(n) = \sum_{i=0}^{l-1} A_i \cdot X(n - i)$$

FIGS. 8 (A) and (B) show examples of the hardware configuration of transversal filters. In the drawings, reference numeral 1 denotes a delay element (R), 2 a multiplier and 3 an adder. A delay element 1, multiplier 2 and adder 3 constitute one tap.

FIG. 8 (A) shows a transposed-type transversal filter and FIG. 8 (B) a direct-type transversal filter. These filters multiply each of the signals input during a preceding sampling time by a predetermined filter coefficient and then add the signals to produce an output signal at a current time. The delay element 1 is constituted as an edge trigger shift register and the multiplier 2 is constituted as a memory register in which the filter coefficient is stored. In some arrangements a suitable pipeline register is provided between adders.

Some transversal filters use a sum-of-products computer such as the one shown in FIG. 9 denoted by the reference numeral 4. These are differentiated from the filters illustrated in FIG. 8 by whether the Xo of the data input to the filter can be derived bit by bit, or only the initial data of a data block.

In either embodiment, the output signal in the direct-type transversal filter can be expressed by $$Y(n) = A_o X_n + A_1 \cdot X_{n-1} + \ldots + A_{l-1} \cdot X_{n-l+1}$$

and in the transposed-type transversal filter by $$Y(n) = (A_o X_n + (A_1 \cdot X_{n-1} + ( \ldots + (A_{l-1} \cdot X_{n-l+1})) \ldots ))$$

In a digital filter the filtering is effected by digital processing. As this offers a high degree of precision and is suited to adaptive control and the like, digital filtering is used in many fields. Moreover, the recent advances in LSI technology enable such filters to be fabricated as single modules or as a combination of multiple modules which are compact and highly reliable.

As an example of adaptive control, an unknown system can be modeled by generating an error signal between a signal from the transversal filter and a signal from a target system and automatically adjusting the filter coefficients in accordance with this error signal (see pages 6 and 7 of "Introduction to Adaptive Filtering" published by Gendai Kogakusha 10 Sep. 1987).

Transversal filters are also used in ghost cancelers. Ghosting is usually caused by a phenomenon that a television signal reflected by obstacles such as tall buildings and mountains is superimposed on a signal received directly, i.e., without being reflected by any such obstacle. That is, a ghost signal is produced by the propagation of the original transmission signal along various paths, causing a kind of modulation of the transmission time, amplitude and phase of the input signal. A ghost canceler cancels ghost signals by passing the input signal through a transversal filter in which the filter coefficient can be varied.

A method for inserting a ghost-cancelling reference signal in the broadcast signal to control ghost cancelers is described in an article entitled "Inserting a ghost-canceler-control reference signal in the television broadcast signal" published in issue number 432 of Nikkei Electronics, 9 Sep. 1987, page 220.

The principle involved is illustrated in FIG. 10. An input signal f(t) is input directly into an adder 11, and is also input into a one-dimensional transversal filter 10 whose output signal is added to the original input signal by the adder 11. The output of the adder 11 is fed into a filter coefficient controller 12, which receives a reference signal Ref. To cancel the ghost signals described above, the filter coefficients of the transversal filter 10 are adjusted so that the output signal derived from the adder 11 within a period of insertion of the ghost-cancelling reference signal into the input signal f(t) may coincide with the reference signal Ref.

Ghost signals will be dependent on the various physical conditions of the signal propagation path on the transmission and receiving sides. Such conditions include the presence of structures, vibration, the angles concerned, reflection of the waves, vibration of the transmitting and/or receiving antennas, wind direction and wind speed, temperature, humidity and other three-dimensional physical conditions. Therefore, to prevent the appearance of ghost signals, it is required to use an adaptive control to change the coefficients of the transversal filter 10 from moment to moment.

Such a transversal filter is usually realized as a single LSI chip or module, or as a plurality of the same type of LSI chips or modules with a plurality of taps provided in the LSI chips. Overflow can occur unless the transversal filter is arranged in such a manner that the adder nearest the output side has a higher number of bits. However, as in an ordinary transversal filter the bit width and bit range of the adder of each tap is fixed, there would occur an overflow at each tap of the transversal filter. The occurrence of overflow or other such anomalies can lead to generation of an inaccurate output signal at the tap concerned, thus making the predetermined filter characteristics unobtainable. Overflow therefore gives rise to the problem of how it should be communicated to the system, and how the system should respond.

As conventional transversal filters lack means for dealing with such anomalies, the occurrence of such anomalies has either rendered the predetermined characteristics unobtainable or has caused the entire system to malfunction. For example, in the unknown system, the transversal filter performs no normal filtering with the result that the whole system doesn't function at all. Furthermore, the ghost canceler loses a function to remove the ghost signal, thus causing the original video signal to be degraded in quality.

The object of the present invention is to solve the above problems and to provide an arithmetic unit using a digital filter which is capable of controlling an arithmetic operation in the digital filter when anomalies such as overflow occur therein.

SUMMARY OF THE INVENTION

To solve the above problems, the present invention uses an arrangement in an arithmetic unit using a digital filter in which a signal filtered by the digital filter and an original signal are processed to derive therefrom an arithmetic signal, characterized in that use of the filtered signal is compulsorily interrupted when anomalies, such as on overflow condition, occur in the digital filter.

With such an arrangement, use of the filtered signal is compulsorily interrupted when anomalies occur in the digital filter. Thus, the arithmetic unit functions in such a manner that it bypasses the digital filter and operates without any filtering. Therefore, the filtering function using the digital filter is interrupted to prevent the degradation in arithmetic operation as much as possible without using the digital filter in which the anomalies occurred. This means an introduction of a failsafe.

BRIEF DESCRIPTION OF THE DRAWINGS

FIGS. 1 shows a block diagram showing an arrangement of an arithmetic unit; FIGS. 2 and. 3 are circuit diagrams showing an arrangement for rendering the output zero when anomalies occur; FIGS. 4 (A) and (B) are circuit diagrams for detecting anomalies when a transversal filter uses a single module.

Figure 5:
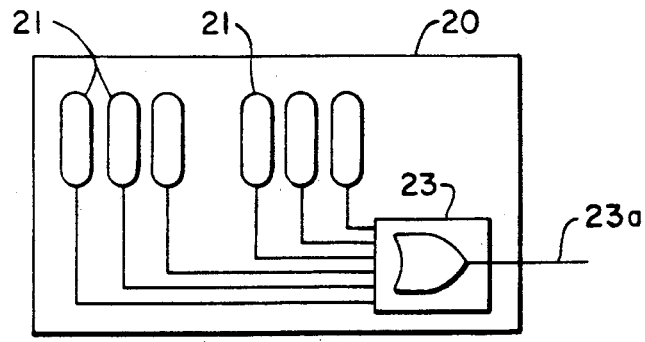
FIG. 5 is a block diagram of one module of the transversal filter.

Throughout the various figures, the following reference numerals refer to the following elements: "1" to Delay element, "2" to a multiplier, "3" to an adder, "15" to an OR circuit, "20" to a Transversal filter, "31" to an Adder, "28" to an Overflow analysis logic circuit (OALC), "30" to another Transversal filter, and "32" to a Multiplexer.

DESCRIPTION OF THE EMBODIMENTS

Details of the present invention will now be described with reference to the embodiments illustrated in the drawings.

FIG. 1 shows an arithmetic unit 30 which receives an input signal x(t) and operates a function f(x,t). Reference numeral 31 denotes an arithmetic unit which calculates, for example, adds an input signal x and an output signal from the arithmetic unit 30.

Figure 10:
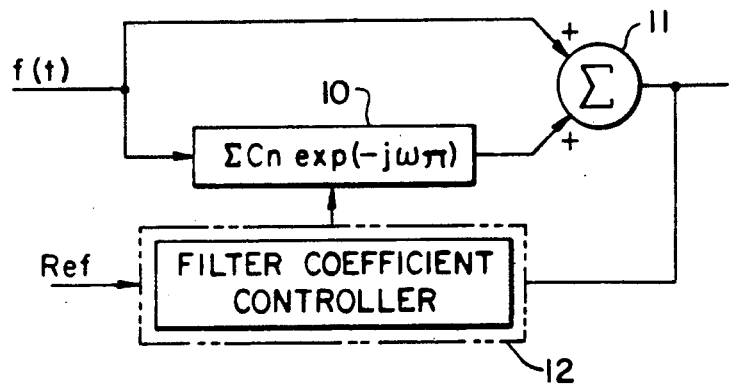
FIG. 10 is a block diagram of a ghost canceler.

Assume now that such an arithmetic unit is, for example, a ghost canceler. In this case, the arithmetic unit 3D is comprised of a transversal filter and the arithmetic unit 31 is comprised of an adder. This corresponds to an arrangement in which the filter coefficient controller 12 in FIG. 10 is omitted. In this embodiment, if an anomaly such as overflow arises in the digital filter, the transversal filter becomes abnormal in filtering function and loses a function to remove the ghost. Thus, the adder 31 produces a degraded image signal, eventually making it impossible to identify the image.

To prevent this, the invention uses an arrangement in which a multiplexer 32 is connected between the transversal filter 30 and the adder 31, as shown in FIG. 2. The multiplexer 32 passes the output signal from the transversal filter 30 into the input of the adder 31 with its level unchanged or changed into zero depending upon the anomalous signal in the transversal filter 30.

In such an arrangement, the multiplexer 32 functions to render the output signal from the transversal filter zero compulsorily when the anomaly such as overflow occurred in the digital filter 30. This causes the adder 31 to produce an output signal z corresponding to the original signal x without any change. In the case of the ghost canceler, the transversal filter in which the anomaly arises is not used and its filtering function is interrupted. As a result, the degradation of the image is remarkably reduced with its damage suppressed to such an degree that a ghost image still exists.

FIG. 3 shows another embodiment in which the multiplexer 32 of FIG. 2 is replaced with AND gates 33. In this embodiment, a low-level signal is applied to each of the AND gate 33 when an anomalous signal occurs in the transversal filter 30. This causes the output of the transversal filter 30 to be rendered zero with the same effect obtained as that in FIG. 2.

Figure 6:
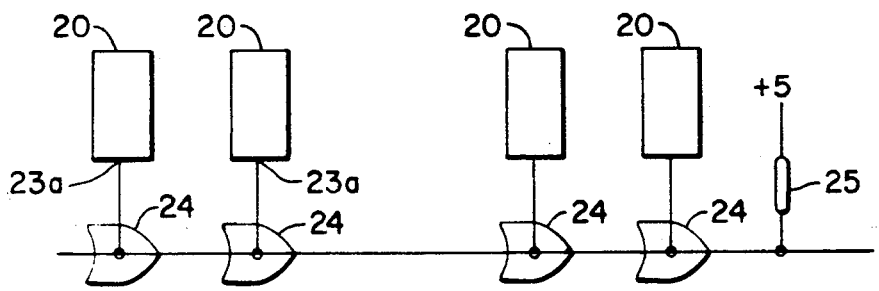
FIGS. 6 and 7 are circuit diagrams for detecting anomalies when a transversal filter uses a plurality of modules.
Figure 7:
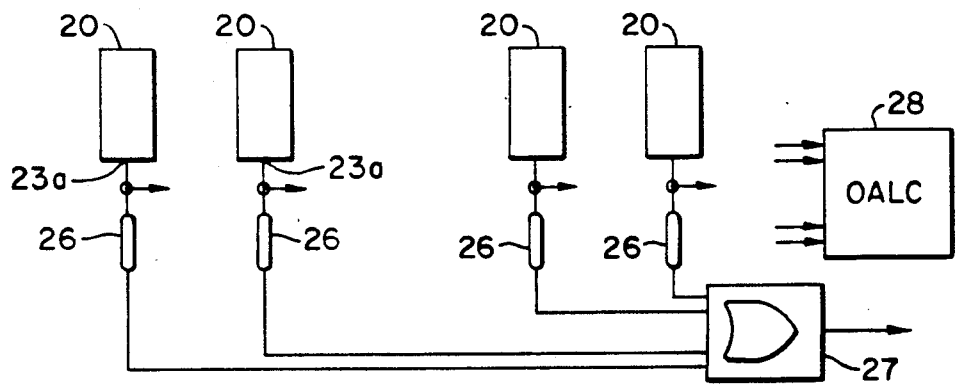
Figure 8A:
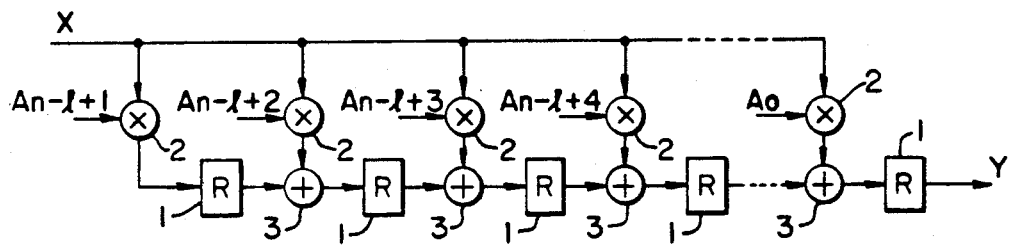
FIGS. 8 (A) and (B) and FIG. 9 are circuit diagrams of conventional transversal filter arrangements.
Figure 8B:
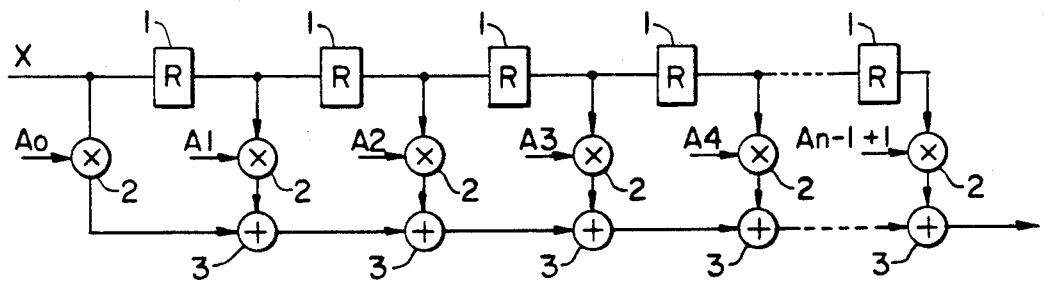
Figure 9:
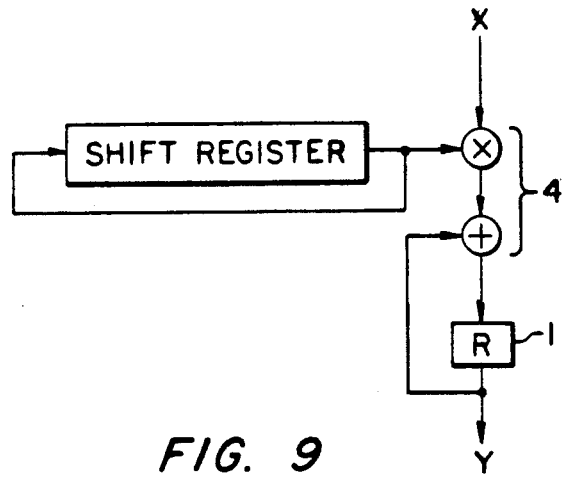

The anomalies in the above-described transversal filter can be detected by an arrangement, for example, such as shown in FIGS. 4 to 7. Elements that are the same as those in FIG. 8 are denoted by the same reference numerals, and the description of such elements is omitted.

Transversal filters are realized as a single module or as a plurality of modules. FIG. 4 illustrates an embodiment of a transversal filter configured as a single module. FIG. 4(A) shows a transposed-type transversal filter and FIG. 4(B) a direct-type transversal filter. In each filter, the logical sum of overflows arising at the taps, that is, of adders 3 is obtained. The logical sum of the preceding adders 3 is input to an OR circuit 15 together with the logical sum of the next adder.

With such an arrangement, if an overflow is produced at any tap, there will be an overflow output signal, for example, in an output 15a of a final stage OR circuit 15, enabling the overflow output to be communicated to the system regardless of the existence or nonexistence of registers between taps.

With the embodiment of FIG. 4 it is not possible to analyze which tap an overflow originates from, but with some systems it is necessary to be able to specify the tap. For such cases, an arrangement can be employed in which the tap from which an overflow comes can be found by providing the modules with overflow flag flip-flops for each of the taps and reading the flag value.

There is an example in which the overflow from the taps of the transversal filter is produced from an open drain or open collector. In this case, the outputs of the adders are connected to a wired OR circuit to obtain the logical sum of the overflows in order to sense the anomalies in the transversal filter. The above-described embodiment employs a single module transversal filter arrangement. When a multiple module arrangement is used, the logical sum of the overflow of the taps of each module is derived followed by the logical sum of the modules, enabling the overflow of the overall system to be detected.

FIG. 5 shows a transversal filter 20 implemented as a single module type transversal filter, corresponding to the transversal filters shown in FIG. 4. The logical sum of the outputs of the taps 21 is derived by the OR circuit 23, using the same method illustrated in FIG. 4. This enables the overflow produced at any tap to appear at an output terminal 23a of an OR circuit 23.

FIG. 6 shows an example in which the overflow output from the modules 20 is an open drain type. The logical sum of the modules 20 can be output using an OR gate 24. In this case, the number of leads used will be the number of modules plus the number of lines of the wired OR bus. However, one wired OR resistor 25 is required.

The open drain arrangement means that the module that produced an overflow cannot be detected directly. Therefore, as shown in FIG. 7, a resistor or a diode 26 is used to isolate the output of each of the modules, the logical sum of the isolated outputs is derived by an OR gate 27 and the overflow outputs of the modules are input to an analysis logic circuit 28 to identify which module an overflow came from.

In some example, the overflow output from the transversal filter modules is implemented as a push-pull type. In this case, use of an active element such as a logic IC is required to obtain the logical sum of the outputs of the modules 20. As the overflow output of a module is not subjected to interference from other modules, a push-pull arrangement enables the module that produced a given overflow to be readily ascertained. The analysis logic circuit 28 used for this purpose need not be provided from the outset. Instead, a printed circuit board can be arranged to allow for the later addition of the analysis logic circuit 28 when required.

While the anomaly described in the foregoing embodiments is overflow arising in a transversal filter, the invention is not limited to the detection of overflow. Instead, the same arrangements can be used to detect other anomalies and render the output of the transversal filter zero compulsorily.

The present invention is not limited to a transversal filter but may be applied to other digital filters, such as a cyclic filter, a lattice filter, or a bi-quad filter.

The arithmetic operation of the original signal and the signal filtered by the digital filter is not limited to an addition, but may be applied to a general arithmetic operation.

The transversal filter modules in the embodiments described above can be realized as integrated circuit chips, as discrete circuits, or as hybrid circuits that combine both types.

As has been described in the foregoing, the present invention uses an arrangement in which the output signal of the digital filter causing the anomaly is made, for example, zero to interrupt the filtering function in the digital filter. This eliminates the necessity of use of any other circuit and enables countermeasures to be taken and the degradation of arithmetic operation to be remarkably reduced.

We claim:

1. A digital signal processing system with signal bypass comprising:
    an arithmetic unit having two inputs;
    a digital filter having a signal input, a signal output and an overflow output;
    means for providing an input signal to one input of the arithmetic unit and to the signal input of the digital filter;
    means connected to the signal output and overflow output of the digital filter for connecting the signal output of the digital filter to the other input of the arithmetic unit unchanged, or changed to a zero level signal in response to the overflow output being active.

2. A digital signal processing system according to claim 1, wherein:
    the arithmetic unit is an adder.

3. A digital signal processing system according to claim 1, wherein:
    the digital filter is a transversal filter.

4. A digital signal processing system according to claim 1, wherein:
    the digital filter comprises:
    a plurality of multipliers;
    a plurality of adders, each adder having an overflow output;
    a plurality of delay elements;
    a plurality of filter coefficient inputs;
    a signal input;
    a signal output; and
    means for indicating anomalies, having a plurality of inputs and an output;
    wherein:
    the multipliers, adders, delay elements, digital filter coefficient inputs, digital signal input, and digital signal output are connected in the form of a transversal filter; and
    the means for indicating anomalies receives at its inputs the overflow outputs of the adders and provides at its output a signal indicating whether any of the adder overflow inputs is active.

5. A digital signal processing system according to claim 1, wherein:
    the form of the digital filter is that of a cyclic filter.

6. A digital signal processing system according to claim 1, wherein:
    the form of the digital filter is that of a lattice filter.

7. A digital signal processing system according to claim 1, wherein:
    the form of the digital filter is that of a bi-quadratic filter.

8. A digital signal processing according to claim 1, wherein:
    the means for connecting is a set of logic "AND" gates, each connected to one bit of the digital filter output and to the overflow indication signal which is arranged to produce a logic "0" when an overflow condition is detected, effectively eliminating the contribution of the digital filter to the output of the digital signal processing system in the event of an overflow condition.

* * * * *